(12) United States Patent
Shinkai et al.

(10) Patent No.: US 11,515,854 B2
(45) Date of Patent: Nov. 29, 2022

(54) LC COMPOSITE COMPONENT

(71) Applicant: TDK Corporation, Tokyo (JP)

(72) Inventors: Yoshihiro Shinkai, Tokyo (JP);
Yuichiro Okuyama, Tokyo (JP);
Yusuke Ariake, Tokyo (JP); Tomoya Hanai, Tokyo (JP); Isao Kanada, Tokyo (JP); Takashi Ohtsuka, Tokyo (JP)

(73) Assignee: TDK Corporation, Tokyo (JP)

( * ) Notice: Subject to any disclaimer, the term of this patent is extended or adjusted under 35 U.S.C. 154(b) by 420 days.

(21) Appl. No.: 16/725,581

(22) Filed: Dec. 23, 2019

(65) Prior Publication Data

US 2020/0211749 A1    Jul. 2, 2020

(30) Foreign Application Priority Data

Dec. 27, 2018 (JP) .............................. JP2018-245222
Nov. 1, 2019 (JP) .............................. JP2019-199960

(51) Int. Cl.

| H03H 7/01 | (2006.01) |
|---|---|
| H01F 17/00 | (2006.01) |
| H01F 27/29 | (2006.01) |
| H05K 1/18 | (2006.01) |
| H03H 1/00 | (2006.01) |

(52) U.S. Cl.
CPC ....... *H03H 7/0115* (2013.01); *H01F 17/0013* (2013.01); *H01F 27/292* (2013.01); *H03H 7/1758* (2013.01); *H05K 1/18* (2013.01); H01F 2017/0026 (2013.01); H01F 2017/0066 (2013.01); H03H 2001/0085 (2013.01); H05K 2201/08 (2013.01)

(58) Field of Classification Search
CPC .... H03H 2001/0085; H01F 2017/0026; H01F 3/00; H01F 17/0013
USPC .................................................. 333/185, 175
See application file for complete search history.

(56) References Cited

U.S. PATENT DOCUMENTS

| 9,647,626 | B2* | 5/2017 | Toda ..................... H03H 7/0115 |
| 2015/0351243 | A1 | 12/2015 | Toda et al. | |
| 2018/0286558 | A1* | 10/2018 | Yokoyama .......... H01F 17/0033 |

FOREIGN PATENT DOCUMENTS

JP            2016-6847 A    1/2016

* cited by examiner

*Primary Examiner* — Rakesh B Patel
(74) *Attorney, Agent, or Firm* — Faegre Drinker Biddle & Reath LLP

(57) ABSTRACT

An LC composite component includes a magnetic substrate with magnetism, a magnetic layer with magnetism, inductors, capacitors, and core parts with magnetism. The magnetic substrate includes a first surface and a second surface on a side opposite to the first surface. The magnetic layer is disposed to face the first surface of the magnetic substrate. The inductors and the capacitors are disposed between the first surface of the magnetic substrate and the magnetic layer. The core parts are disposed between the first surface of the magnetic substrate and the magnetic layer and connected to the magnetic layer. The thickness of the core part is 1.0 or more times the thickness of the magnetic layer, the thickness of the magnetic substrate is 1.0 or more times the thickness of the magnetic layer.

6 Claims, 8 Drawing Sheets

LC COMPOSITE COMPONENT

TECHNICAL FIELD

The present invention relates to an LC composite component.

BACKGROUND

Electronic components used for wireless communication devices such as mobile phones and wireless LAN communication devices have been required to have smaller size and higher performance in recent years. Patent Literature 1 has disclosed an LC composite component including an inductor, a capacitor, a magnetic layer, and a substrate, in which the substrate, the magnetic layer, and the inductor are arranged at a particular positional relation and the substrate has predetermined thickness and complex magnetic permeability.

CITATION LIST

Patent Literature

Patent Literature 1: Japanese Unexamined Patent Publication No. 2016-006847

SUMMARY

However, the LC composite component disclosed in Patent Literature 1 has room for further improvement in point of an insertion loss characteristic of the LC composite component.

In view of the above, an object of the present invention is to provide an LC composite component with the insertion loss characteristic improved further.

An aspect of the present invention relates to an LC composite component comprising: a magnetic substrate with magnetism; a magnetic layer with magnetism; one or more capacitors; one or more inductors; and one or more core parts with magnetism, wherein the magnetic substrate includes a first surface and a second surface on a side opposite to the first surface, the magnetic layer is disposed to face the first surface of the magnetic substrate, the one or more inductors and the one or more capacitors are disposed between the first surface of the magnetic substrate and the magnetic layer, the core parts are disposed between the first surface of the magnetic substrate and the magnetic layer and connected to the magnetic layer, the thickness of the core part is 1.0 or more times the thickness of the magnetic layer in a direction perpendicular to the first surface of the magnetic substrate, the thickness of the magnetic substrate is 1.0 or more times the thickness of the magnetic layer in the direction perpendicular to the first surface of the magnetic substrate, and each of the magnetic substrate, the magnetic layer, and the core parts contains magnetic metal particles and resin.

In one aspect, the thickness of the magnetic substrate may be 3.0 or less times the thickness of the magnetic layer in the direction perpendicular to the first surface of the magnetic substrate.

In one aspect, the average major-axis diameter of the magnetic metal particles may be 120 nm or less.

In one aspect, the average aspect ratio of the magnetic metal particles may be 1.2 to 6.

In one aspect, the saturation magnetization of the magnetic substrate, the magnetic layer, and the core parts may be 90 emu/g or more.

In one aspect, the CV value of the aspect ratios of the magnetic metal particles may be 0.4 or less.

In one aspect, the magnetic metal particles may contain at least one kind selected from the group consisting of Fe, Co, and Ni as a main component.

Advantageous Effects of the Invention

According to the present invention, an LC composite component with the insertion loss characteristic improved further can be provided.

DETAILED DESCRIPTION

A preferred embodiment of the present invention is hereinafter described. However, the present invention is not limited to the following embodiment.

(LC Composite Component)

Figure 1:
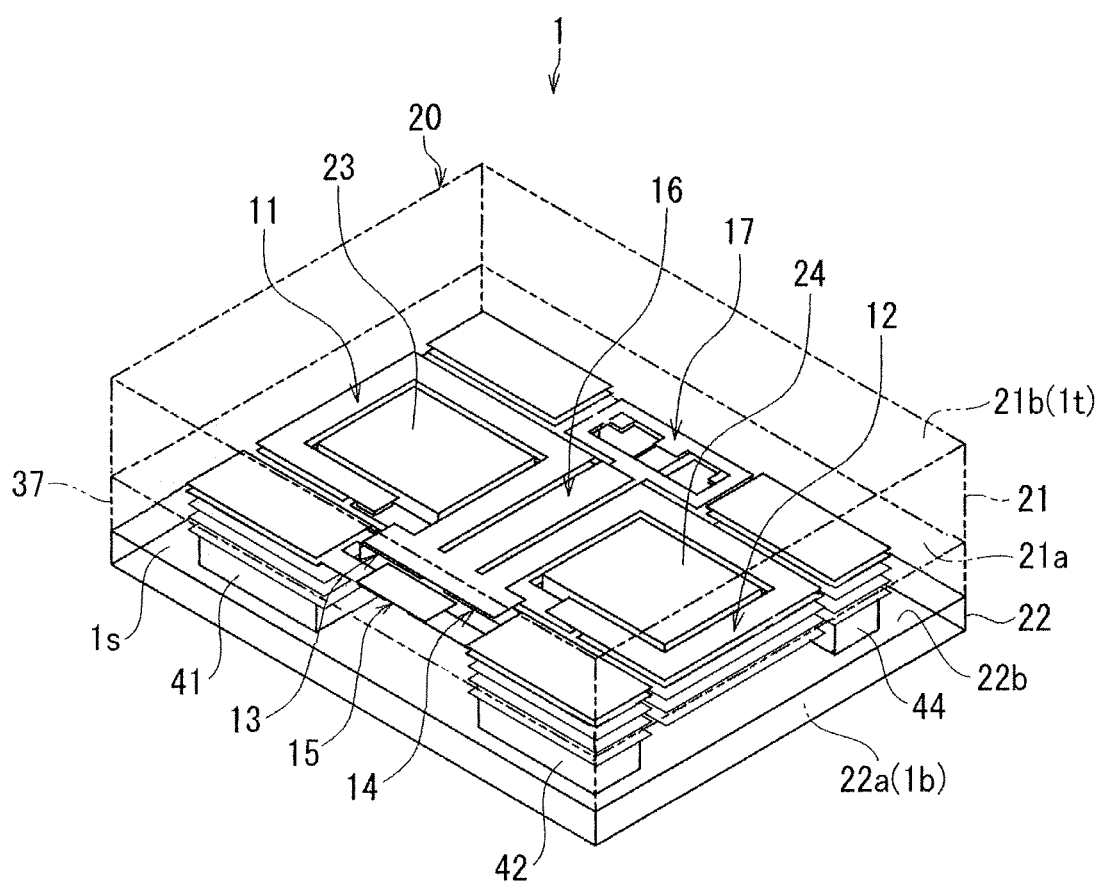
FIG. 1 is a perspective view illustrating a structure of an LC composite component according to one embodiment of the present invention.
Figure 2:
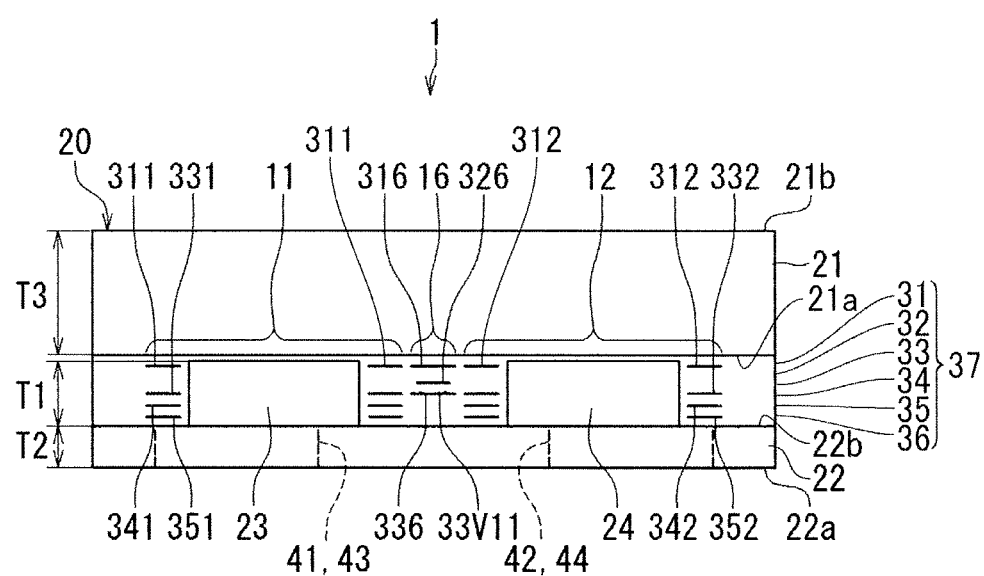
FIG. 2 is a cross-sectional view illustrating a structure of the LC composite component according to one embodiment of the present invention.

With reference to FIG. 1 and FIG. 2, an LC composite component according to one embodiment of the present invention is described. FIG. 1 is a perspective view illustrating a structure of an LC composite component 1 according to the present embodiment. FIG. 2 is a cross-sectional view illustrating the structure of the LC composite component according to the present embodiment.

The LC composite component 1 includes a magnetic substrate 21 with magnetism, a magnetic layer 22 with magnetism, inductors 11, 12, and 17, capacitors 13 to 16, core parts 23 and 24 with magnetism, and a dielectric multilayer body 37.

As illustrated in FIG. 1 and FIG. 2, the magnetic substrate 21 is a flat plate including a first surface 21a and a second surface 21b on the side opposite to the first surface. The thickness of the magnetic substrate 21 in a direction perpendicular to the first surface 21a is not limited in particular and for example, in order to make the shape of the obtained LC composite component practical and facilitate the production, the thickness may be 30 to 200 μm, and is preferably 40 to 100 μm. The material of the magnetic substrate 21 is described below.

The magnetic layer 22 is a flat plate including a first surface 22a and a second surface 22b, and the second surface 22b is disposed to face the first surface 21a of the magnetic substrate 21. In the present specification, the term magnetism refers to ferromagnetism or ferrimagnetism. The material of the magnetic layer 22 is described below.

The dielectric multilayer body 37 is disposed between the first surface 21a of the magnetic substrate 21 and the magnetic layer 22 (second surface 22b). The dielectric multilayer body 37 includes a plurality of dielectric layers 31 to 36 stacked as illustrated in FIG. 2. Each of the dielectric layers 31 to 36 includes a dielectric material. Examples of the dielectric material include resin and ceramic. Examples of the resin include polyimide resin, benzocyclobutene resin, bismaleimide-triazine resin (BT resin), epoxy resin, and acrylic resin, and examples of the ceramic include silicon nitride and alumina.

The LC composite component 1 has a rectangular parallelepiped shape, and includes an upper surface 1t, a bottom surface 1b, and four side surfaces 1s. In the present embodiment, the upper surface 1t of the LC composite component 1 is formed by the second surface 21b of the magnetic substrate 21. The bottom surface 1b of the LC composite component 1 is formed by the first surface 22a of the magnetic layer 22. The LC composite component 1 is mounted on a mount substrate so that, for example, the bottom surface 1b of the LC composite component 1, that is, the first surface 22a of the magnetic layer 22 faces an upper surface of the mount substrate.

The inductors 11, 12, and 17, the capacitors 13 to 16, and the core parts 23 and 24 are disposed between the first surface 21a of the magnetic substrate 21 and the second surface 22b of the magnetic layer 22, that is, in the dielectric multilayer body 37. In the present embodiment, the capacitors 13 to 16 are disposed at the position not overlapping with the other inductors 11, 12, and 17 when viewed from a direction perpendicular to the first surface 21a. Examples of the material of conductor parts for the inductors and the capacitors include Cu, Al, and Ag. The details of the inductors and the capacitors are described below.

The core parts 23 and 24 have a columnar shape, and are disposed at an axis of the coil structure of the inductors 11 and 12, respectively. The core parts 23 and 24 are connected to the magnetic layer 22. In the present specification, "the core parts 23 and 24 are connected to the magnetic layer 22" means both modes: a mode in which the core parts 23 and 24 and the magnetic layer 22 are in direct connection (in contact); and the core parts 23 and 24 and the magnetic layer 22 are not in direct connection (in contact) but magnetically connected through, for example, a non-magnetic (such as dielectric) layer with a thickness of about 0.1 to 10 μm. In FIG. 2, the core parts 23 and 24 and the magnetic layer 22 are in contact with each other. The material of the core part is described below. It is preferable that the core parts 23 and 24 are not in direct contact with the magnetic substrate 21. That is to say, it is preferable that a non-magnetic (such as dielectric) layer with a thickness of about 0.1 to 10 μm, for example, is provided between the core parts 23 and 24 and the magnetic substrate 21 as illustrated in FIG. 2. However, the core parts 23 and 24 may be in direct contact with the magnetic substrate 21.

As illustrated in FIG. 2, assuming that the thickness of the core parts 23 and 24 in the direction perpendicular to the first surface 21a of the magnetic substrate 21 is T1 and the thickness of the magnetic layer 22 in the direction perpendicular to the first surface 21a of the magnetic substrate 21 is T2, the thickness T1 of the core parts 23 and 24 is 1.0 or more times, preferably 1.2 or more times, more preferably 2.0 or more times, and much more preferably 3.0 or more times the thickness T2 of the magnetic layer 22. The thickness T1 of the core parts 23 and 24 may be less than or equal to 10 times the thickness T2 of the magnetic layer 22.

Thus, the insertion loss at less than the cut-off frequency in the LC composite component can be reduced, and moreover, the insertion loss at more than the cut-off frequency can be increased. It is considered that this is because the inductance of the inductor is increased while the loss in the inductor core is suppressed, so that the loss in the inductor is reduced.

From the similar perspective, as illustrated in FIG. 2, assuming that the thickness of the magnetic substrate 21 in the direction perpendicular to the first surface 21a of the magnetic substrate 21 is T3, the thickness T3 of the magnetic substrate 21 is 1.0 or more times, preferably 1.1 or more times, and more preferably 1.2 or more times the thickness T2 of the magnetic layer 22. The thickness T3 of the magnetic substrate 21 may be 3.0 or less times, preferably 2.0 or less times the thickness T2 of the magnetic layer 22.

The thickness of the core parts 23 and 24 is not limited in particular and for example, in order to make the shape of the obtained LC composite component practical and facilitate the production, the thickness may be 30 to 200 μm and is preferably 100 to 150 μm. Note that it is preferable that the thickness of the core parts 23 and 24 is more than or equal to the length of the coil structure of the inductors 11 and 12 in the axial direction.

When the inductors 11 and 12 of the LC composite component 1 include the core parts 23 and 24, respectively, the inductance of the inductor can become higher than that when the inductors 11 and 12 of the LC composite component 1 do not include the core parts 23 and 24.

(Material of Magnetic Substrate, Magnetic Layer and Core Part)

The magnetic substrate 21, the magnetic layer 22 and the core parts 23 and 24 contain resin and magnetic metal particles with magnetism.

In the present embodiment, the particle diameter of the magnetic metal particle is not limited in particular. It is preferable that the average major-axis diameter of the magnetic metal particles is 120 nm or less.

When this is satisfied, the insertion loss of the LC composite component at less than the cut-off frequency is easily suppressed and the insertion loss at more than the cut-off frequency is increased easily.

One of the conceivable reasons is that, for example, the filling property of the magnetic metal particles in the magnetic layer 22 and the core parts 23 and 24 is improved and by achieving the high magnetic permeability, the inductance of the inductor can be increased and at the same time, the eddy current in the core parts 23 and 24 of the inductor can be suppressed.

From the similar perspective, the average major-axis diameter of the magnetic metal particles is preferably 100 nm or less, more preferably 80 nm or less. In the present embodiment, the average major-axis diameter of the magnetic metal particles may be 30 nm or more. From the similar perspective, the average major-axis diameter of the magnetic metal particles is preferably 40 nm or more. In addition, the average minor-axis diameter of the magnetic metal particles 4 is, for example, about 5 to 50 nm and may be 7 to 30 nm.

It is preferable that the average aspect ratio of the magnetic metal particles is 1.2 to 6. In the present embodiment, the average aspect ratio is the average value of the ratios (aspect ratios) of the major-axis diameter to the minor-axis diameter of the magnetic metal particles.

When the average aspect ratio is less than 1.2, the shape anisotropy becomes too low and the natural resonance frequency becomes too low; thus, the loss in the inductor core by the natural resonance may increase. When the aspect ratio is more than 6, the shape anisotropy becomes too high and the density decreases because the filling property deteriorates; thus, the magnetic permeability decreases and it may become difficult to increase the inductance of the inductor.

From the similar perspective, the average aspect ratio of the magnetic metal particles is preferably 1.3 or more and 4 or less, also preferably 1.5 or more and 3 or less. In addition, it is also preferable that the aspect ratio is 2 or more.

In the present embodiment, the CV value of the aspect ratios of the magnetic metal particles may be 0.4 or less. CV represents the coefficient of variation and can be obtained from the following expression:

Coefficient of variation (CV)=standard deviation value/average value

When the CV value of the aspect ratios of the magnetic metal particles is 0.4 or less, the variation in demagnetizing factor can be suppressed. Since the natural resonance frequency is in proportion to the difference in demagnetizing factor (minor axis–major axis), the variation in natural resonance frequency can be suppressed accordingly and the line width of the natural resonance peak can be narrowed. Therefore, while the loss in the inductor core due to the natural resonance is reduced, the inductance of the inductor can be increased, and the insertion loss of the LC composite component at less than the cut-off frequency can be decreased and the insertion loss at more than the cut-off frequency can be increased. From the similar perspective, it is preferable that the CV value of the aspect ratios of the magnetic metal particles is 0.3 or less. The CV value of the aspect ratios of the magnetic metal particles may be 0.10 or more.

It is preferable that the magnetic metal particle contains at least one kind selected from the group consisting of Fe, Co, and Ni as a main component, and it is more preferable that the magnetic metal particle contains at least one kind selected from the group consisting of Fe and Co as a main component. In the present specification, the main component refers to the component that is contained by 50 mass % or more. When the magnetic metal particle contains at least one kind selected from the group consisting of Fe, Co, and Ni with high saturation magnetization as the main component, the magnetic substrate 21, the magnetic layer 22 and the core parts 23 and 24 can have the high magnetic permeability. It is preferable that the magnetic metal particle contains Fe, Fe and Co, or Fe and Ni as the main component, more preferable that the magnetic metal particle contains Fe, or Fe and Co as the main component, and particularly preferable that the magnetic metal particle contains Fe and Co as the main component. When the magnetic metal particle contains Fe, Fe and Co, or Fe and Ni with high saturation magnetization as the main component, the magnetic substrate 21, the magnetic layer 22 and the core parts 23 and 24 have the high magnetic permeability. The magnetic substrate 21, the magnetic layer 22 and the core parts 23 and 24 may contain different magnetic metal particles or the same magnetic metal particles. In the present specification, the main component refers to the component that is contained by 50 mass % or more. By such a composition, the natural resonance frequency can be increased.

The magnetic metal particles can include a metal central part and a metal oxide film covering the metal central part. The metal central part has the electric conductive property and the metal oxide film has the insulating property. Since the magnetic metal particle includes the metal oxide film, the insulating property between the magnetic metal particles is obtained and the magnetic loss caused by the eddy current between the particles can be reduced.

In the magnetic metal particle, the metal central part contains the aforementioned element in the magnetic metal particle as metal (zero-valent). Since the metal central part is covered with the metal oxide film, the metal central part can exist in the atmosphere without being oxidized. The metal central part is formed of preferably Fe, Fe—Ni alloy, or Fe—Co alloy, more preferably Fe or Fe—Co alloy, and much more preferably Fe—Co alloy. When the metal central part is formed of Fe, Fe—Ni alloy, or Fe—Co alloy, the saturation magnetization of the magnetic metal particle is improved so that the magnetic permeability becomes high. In the magnetic metal particle, the metal oxide film contains the element in the magnetic metal particle as the oxide.

In the present embodiment, the volume ratio of the magnetic metal particles in the magnetic substrate 21, the magnetic layer 22 and the core parts 23 and 24 may be, for example, 30 to 60 vol % and is preferably 40 to 50 vol %. When the volume ratio of the magnetic metal particles is 30 vol % or more, the magnetic substrate 21, the magnetic layer 22 and the core parts 23 and 24 can easily have the desired magnetic characteristic. When the ratio of the magnetic metal particles is 60 vol % or less, handling in the processing becomes easy. Note that in the present specification, the volume ratio in the magnetic substrate 21, the magnetic layer 22 and the core parts 23 and 24 is the ratio in the magnetic substrate 21, the magnetic layer 22 and the core parts 23 and 24 except the void.

The resin is the resin with the electrically insulating property (insulating resin), and is the material that exists between the magnetic metal particles to bind them in the magnetic substrate 21, the magnetic layer 22 and the core parts 23 and 24, and can improve the insulating property between the magnetic metal particles. Examples of the insulating resin include silicone resin, phenol resin, acrylic resin, epoxy resin, and a cured product thereof. Any of these kinds may be used alone or two or more kinds thereof may be used in combination. If necessary, an additive, for example, a surface treatment agent such as a coupling agent or a dispersant, a heat stabilizer, a plasticizer or the like may be used.

In the present embodiment, the volume ratio of the resin in the magnetic substrate 21, the magnetic layer 22 and the core parts 23 and 24 may be, for example, 40 to 70 vol %, and is preferably 50 to 60 vol %. When the volume ratio of the resin is 40 vol % or more, the insulating property and the binding power between the magnetic metal particles are easily obtained. When the volume ratio of the resin is 70 vol % or less, the characteristic by the magnetic metal particles is obtained easily in the magnetic substrate 21, the magnetic layer 22 and the core parts 23 and 24.

The saturation magnetization of the magnetic substrate 21, the magnetic layer 22 and the core parts 23 and 24 is not limited to a particular value, and may be, for example, 90 emu/g or more. When the saturation magnetization is 90 emu/g or more, the magnetic permeability of the magnetic substrate 21, the magnetic layer 22 and the core parts 23 and 24 can be improved. Moreover, the natural resonance frequency can be increased. From the similar perspective, the saturation magnetization is preferably 100 emu/g or more and more preferably 120 emu/g or more. The saturation magnetization may be 200 emu/g or less.

With reference to FIGS. 3A to 3C and FIGS. 4A to 4C, the detailed structure of the dielectric multilayer body 37, the capacitors 13 to 16, and the inductors 11, 12, and 17 is described. In the present embodiment, the dielectric multilayer body 37 of the LC composite component 1 includes the six dielectric layers 31, 32, 33, 34, 35, and 36. The dielectric layers 31 to 36 are disposed between the magnetic substrate 21 and the magnetic layer 22, and are disposed in this order from the first surface 21a side of the magnetic substrate 21. Each of the dielectric layers 31 to 36 includes a first surface that faces to the same direction as the first surface 21a of the magnetic substrate 21, and a second surface that faces to the same direction as the second surface 21b of the magnetic substrate 21. Note that the core parts 23 and 24 are omitted in FIGS. 3A to 3C and FIGS. 4A to 4C.

Figure 3A:
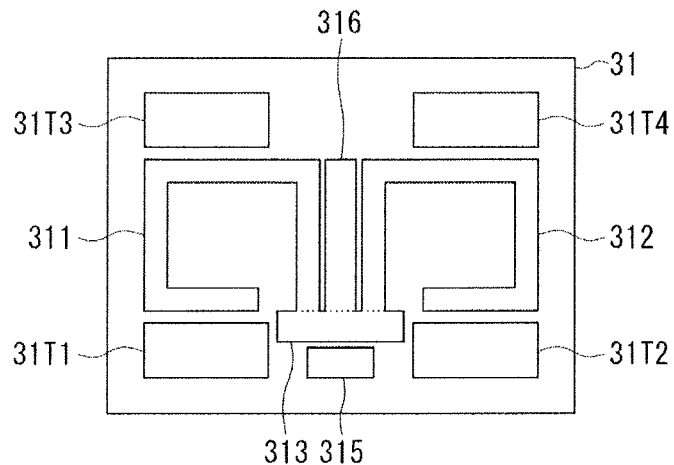
FIG. 3A is an explanatory view for describing a structure of a dielectric layer in the LC composite component according to one embodiment of the present invention.

FIG. 3A illustrates the first surface of the dielectric layer 31. On the first surface of the dielectric layer 31, a conductor part 311 for the inductor 11, a conductor part 312 for the inductor 12, a conductor part 313 for the capacitors 13 and 14, a conductor part 315 for the capacitor 15, a conductor part 316 for the capacitor 16, and conductor parts 31T1, 31T2, 31T3, and 31T4 for the terminals are formed. Note that FIG. 3A illustrates a state in which the conductor parts are viewed from the second surface side of the dielectric layer 31. The arrangement of the conductor parts in FIG. 3A is as follows. The conductor part 311 for the inductor 11 is disposed in a left area with respect to a center in a left-right direction. The conductor part 312 for the inductor 12 is disposed in a right area with respect to the center in the left-right direction. The conductor part 316 for the capacitor 16 is disposed between the conductor part 311 for the inductor 11 and the conductor part 312 for the inductor 12. The conductor part 313 for the capacitors 13 and 14 is disposed below the conductor parts 311 for the inductor 11, the conductor parts 312 for the inductor 12, and the conductor part 316 for the capacitor 16. The conductor part 315 for the capacitor 15 is disposed below the conductor part 313 for the capacitors 13 and 14. The conductor part 31T1 for the terminal is disposed near a lower left corner. The conductor part 31T2 for the terminal is disposed near a lower right corner. The conductor part 31T3 for the terminal is disposed near an upper left corner. The conductor part 31T4 for the terminal is disposed near an upper right corner.

The conductor part 313 for the capacitors 13 and 14 is connected to each end of the conductor part 311 for the inductor 11, the conductor part 312 for the inductor 12, and the conductor part 316 for the capacitor 16. In FIG. 3A, the border between the two conductor parts is drawn with a dotted line. In the drawings similar to FIG. 3A used in the following description, the expression is similar to that of FIG. 3A. The conductor part 311 for the inductor 11 and the conductor part 312 for the inductor 12 are both linear conductor parts extending in a ring shape from one end to the other end thereof.

Figure 3B:
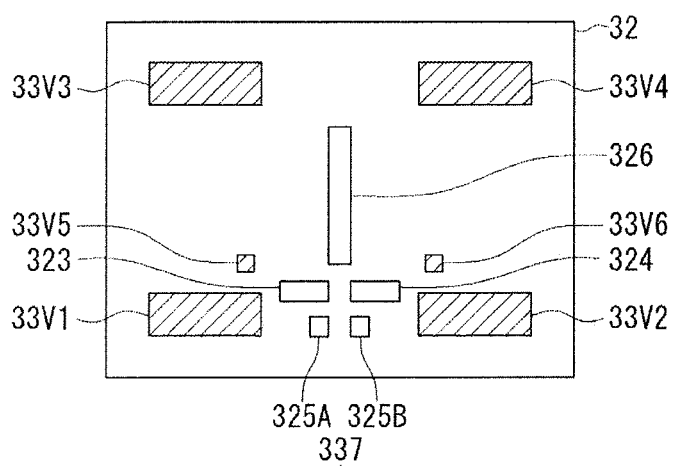
FIG. 3B is an explanatory view for describing a structure of a dielectric layer in the LC composite component according to one embodiment of the present invention.

FIG. 3B illustrates the first surface of the dielectric layer 32. On the first surface of the dielectric layer 32, a conductor part 323 for the capacitor 13, a conductor part 324 for the capacitor 14, conductor parts 325A and 325B for the capacitor 15, and a conductor part 326 for the capacitor 16 are formed. Note that FIG. 3B illustrates a state in which the conductor parts are viewed from the second surface side of the dielectric layer 32. The arrangement of the conductor parts in FIG. 3B is as follows. That is to say, the conductor part 326 for the capacitor 16 is disposed in a substantially central position in the left-right direction. The conductor part 323 for the capacitor 13 and the conductor part 324 for the capacitor 14 are disposed in this order from the left side at the position below the conductor part 326 for the capacitor 16. The conductor parts 325A and 325B for the capacitor 15 are disposed in this order from the left side at the position below the conductor part 323 for the capacitor 13 and the conductor part 324 for the capacitor 14.

The conductor part 323 for the capacitor 13 and the conductor part 324 for the capacitor 14 face the conductor part 313 for the capacitors 13 and 14 illustrated in FIG. 3A through the dielectric layer 32. The capacitor 13 in FIG. 5 includes the conductor part 313 for the capacitors 13 and 14, the conductor part 323 for the capacitor 13, and a part of the dielectric layer 32 positioned between them. The capacitor 14 in FIG. 5 includes the conductor part 313 for the capacitors 13 and 14, the conductor part 324 for the capacitor 14, and a part of the dielectric layer 32 positioned between them. The conductor parts 325A and 325B for the capacitor 15 face the conductor part 315 for the capacitor 15 illustrated in FIG. 3A through the dielectric layer 32. The capacitor 15 in FIG. 5 includes the conductor parts 315 and 325A and 325B for the capacitor 15 and a part of the dielectric layer 32 positioned between them. The conductor part 326 for the capacitor 16 faces the conductor part 316 for the capacitor 16 illustrated in FIG. 3A through the dielectric layer 32. The capacitor 16 in FIG. 5 includes the conductor parts 316 and 326 for the capacitor 16 and a part of the dielectric layer 32 positioned between them.

The LC composite component 1 includes conductor parts 33V1, 33V2, 33V3, 33V4, 33V5, and 33V6 that penetrate the dielectric layers 32 and 33. In FIG. 3B, the conductor parts 33V1 to 33V6 are hatched. To the conductor parts 31T1 to 31T4 for the terminals, the conductor part 311 for the inductor 11, and the conductor part 312 for the inductor 12 illustrated in FIG. 3A, one ends of the conductor parts 33V1 to 33V6 are connected, respectively.

Figure 3C:
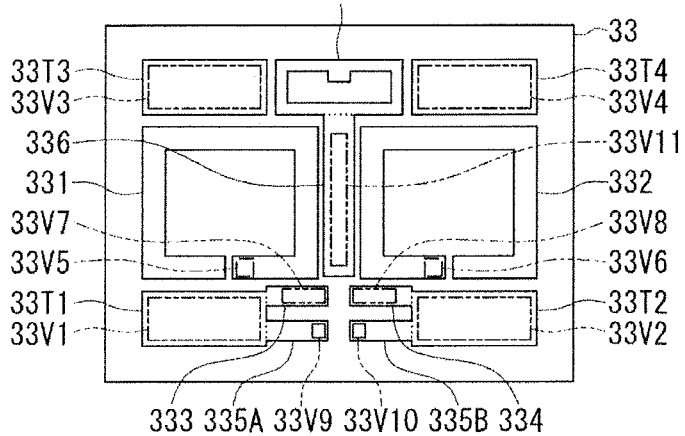
FIG. 3C is an explanatory view for describing a structure of a dielectric layer in the LC composite component according to one embodiment of the present invention.

FIG. 3C illustrates the first surface of the dielectric layer 33. On the first surface of the dielectric layer 33, a conductor part 331 for the inductor 11, a conductor part 332 for the inductor 12, a conductor part 337 for the inductor 17, conductor parts 333, 334, 335A, 335B, and 336 for connection, and conductor parts 33T1, 33T2, 33T3, and 33T4 for the terminals are formed. FIG. 3C illustrates the state in which the conductor parts are viewed from the second surface side of the dielectric layer 33. The arrangement of the conductor parts in FIG. 3C is as follows. The conductor part 331 for the inductor 11 is disposed in the left area with respect to the center in the left-right direction. The conductor part 336 for the connection is disposed between the conductor part 331 for the inductor 11 and the conductor part 332 for the inductor 12. The conductor parts 333 and 334 for the connection are disposed in this order from the left side at the position below the conductor part 331 for the inductor 11, the conductor part 332 for the inductor 12, and the conductor part 336 for the connection. The conductor parts 335A and 335B for the connection are disposed in this order from the left side at the position below the conductor parts 333 and 334 for the connection. The conductor part 337 for the inductor 17 is disposed at the position above the conductor part 331 for the inductor 11, the conductor part 332 for the inductor 12, and the conductor part 336 for the connection. The conductor part 33T1 for the terminal is disposed near the lower left corner. The conductor part 33T2 for the terminal is disposed near the lower right corner. The conductor part 33T3 for the terminal is disposed near the upper left corner. The conductor part 33T4 for the terminal is disposed near the upper right corner.

The conductor part 33T1 for the terminal is connected to one end of each of the conductor parts 333 and 335A for the connection. The conductor part 33T2 for the terminal is connected to one end of each of the conductor parts 334 and 335B for the connection. The conductor part 337 for the inductor 17 is connected to one end of the conductor part 336 for the connection. The conductor part 331 for the inductor 11 and the conductor part 332 for the inductor 12 are both linear conductor parts extending in a ring shape from one end to multiple ends.

Each of the conductor part 331 for the inductor 11, the conductor part 332 for the inductor 12, and the conductor parts 33T1 to 33T4 for the terminals are disposed at the positions respectively overlapping with the conductor part 311 for the inductor 11, the conductor part 312 for the inductor 12, and the conductor parts 31T1 to 31T4 for the terminals illustrated in FIG. 3A when viewed from a direction (the same as the direction perpendicular to the first surface of the dielectric layer 33) that is perpendicular to the first surface 21a of the magnetic substrate 21. When viewed from the direction perpendicular to the first surface 21a of the magnetic substrate 21, the conductor parts 333, 334, 335A, 335B, and 336 for the connection are disposed at the positions respectively overlapping with the conductor part 323 for the capacitor 13, the conductor part 324 for the capacitor 14, the conductor parts 325A and 325B for the capacitor 15, and the conductor part 326 for the capacitor 16 illustrated in FIG. 3B.

The LC composite component 1 includes conductor parts 33V7, 33V8, 33V9, 33V10, and 33V11 that penetrate the dielectric layer 33. In FIG. 3C, the conductor parts 33V1 to 33V11 are drawn with a two-dot chain line. To the conductor parts 33T1 to 33T4 for the terminals, the conductor part 331 for the inductor 11, and the conductor part 332 for the inductor 11, the other ends of the conductor parts 33V1 to 33V6 are connected, respectively. To the conductor part 323 for the capacitor 13, the conductor part 324 for the capacitor 14, the conductor parts 325A and 325B for the capacitor 15, and the conductor part 326 for the capacitor 16 illustrated in FIG. 3B, one ends of the conductor parts 33V7 to 33V11 are connected, respectively. To the conductor parts 333, 334, 335A, 335B, and 336 for the connection, the other ends of the conductor parts 33V7 to 33V11 are connected, respectively.

Figure 4A:
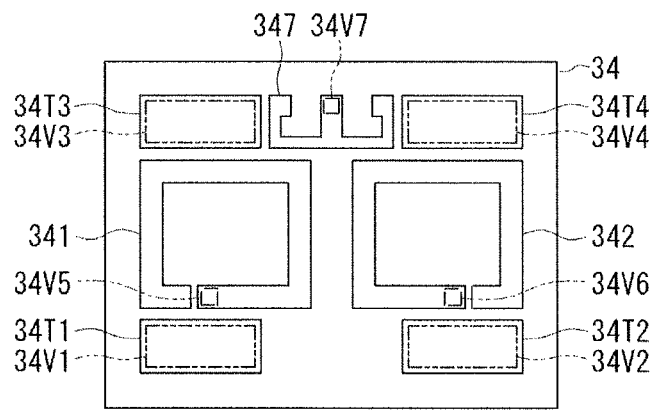
FIG. 4A is an explanatory view for describing a structure of a dielectric layer in the LC composite component according to one embodiment of the present invention.
Figure 4B:
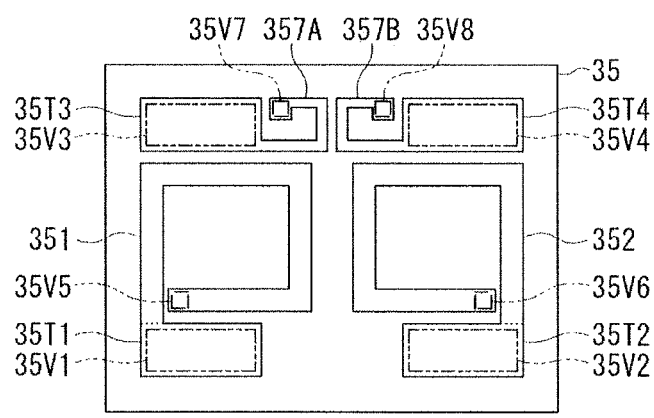
FIG. 4B is an explanatory view for describing a structure of a dielectric layer in the LC composite component according to one embodiment of the present invention.
Figure 4C:
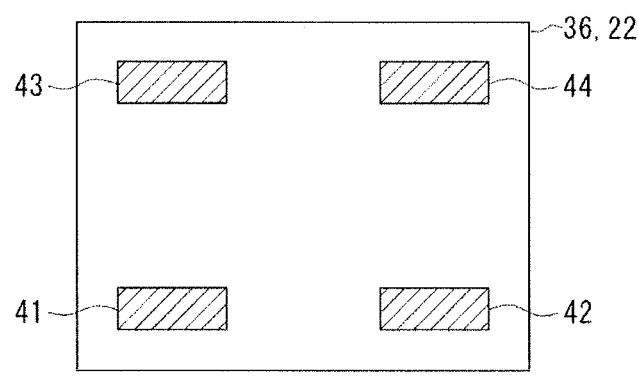
FIG. 4C is an explanatory view for describing a structure of a dielectric layer in the LC composite component according to one embodiment of the present invention.

FIG. 4A illustrates the first surface of the dielectric layer 34. On the first surface of the dielectric layer 34, a conductor part 341 for the inductor 11, a conductor part 342 for the inductor 12, a conductor part 347 for the inductor 17, and conductor parts 34T1, 34T2, 34T3, and 34T4 for the terminals are formed. FIG. 4A illustrates the state in which the conductor parts are viewed from the second surface side of the dielectric layer 34. The arrangement of the conductor parts in FIGS. 4A to 4C is as follows. The conductor part 341 for the inductor 11 is disposed in the left area with respect to the center in the left-right direction. The conductor part 342 for the inductor 12 is disposed in the right area with respect to the center in the left-right direction. The conductor part 347 for the inductor 17 is disposed at the position above the conductor part 341 for the inductor 11 and the conductor part 342 for the inductor 12. The conductor part 34T1 for the terminal is disposed near the lower left corner. The conductor part 34T2 for the terminal is disposed near the lower right corner. The conductor part 34T3 for the terminal is disposed near the upper left corner. The conductor part 34T4 for the terminal is disposed near the upper right corner.

The conductor part 341 for the inductor 11 and the conductor part 342 for the inductor 12 are both linear conductor parts extending in a ring shape from one end to the other end. Each of the conductor part 341 for the inductor 11, the conductor part 342 for the inductor 12, the conductor part 347 for the inductor 17, and the conductor parts 34T1 to 34T4 for the terminals are disposed at the positions respectively overlapping with the conductor part 331 for the inductor 11, the conductor part 332 for the inductor 12, the conductor part 337 for the inductor 17, and the conductor parts 31T1 to 31T4 for the terminals illustrated in FIG. 3C when viewed from the direction (the same as the direction perpendicular to the first surface of the dielectric layer 34) that is perpendicular to the first surface 21a of the magnetic substrate 21.

The LC composite component 1 includes conductor parts 34V1, 34V2, 34V3, 34V4, 34V5, 34V6, and 34V7 that penetrate the dielectric layer 34. In FIG. 4A, the conductor parts 34V1 to 34V7 are drawn with a two-dot chain line. To the conductor parts 33T1 to 33T4, the conductor part 331 for the inductor 11, the conductor part 332 for the inductor 12, and the conductor part 337 for the inductor 17 illustrated in FIG. 3C, one ends of the conductor parts 34V1 to 34V7 are connected, respectively. To the conductor parts 34T1 to 34T4 for the terminals, the conductor part 341 for the inductor 11, the conductor part 342 for the inductor 12, and the conductor part 347 for the inductor 17, the other ends of the conductor parts 34V1 to 34V7 are connected, respectively.

FIG. 4B illustrates the first surface of the dielectric layer 35. On the first surface of the dielectric layer 35, a conductor part 351 for the inductor 11, a conductor part 352 for the inductor 12, conductor parts 357A and 357B for the inductor 17, and conductor parts 35T1, 35T2, 35T3, and 35T4 for the terminals are formed. Note that FIG. 4B illustrates the state in which the conductor parts are viewed from the second surface side of the dielectric layer 35. The arrangement of the conductor parts in FIG. 4B is as follows. The conductor part 351 for the inductor 11 is disposed in the left area with respect to the center in the left-right direction. The conductor part 352 for the inductor 12 is disposed in the right area with respect to the center in the left-right direction. The conductor parts 357A and 357B for the inductor 17 are disposed in this order from the left side at the position above the conductor part 351 for the inductor 11 and the conductor part 352 for the inductor 12. The conductor part 35T1 for the terminal is disposed near the lower left corner. The conductor part 35T2 for the terminal is disposed near the lower right corner. The conductor part 35T3 for the terminal is disposed near the upper left corner. The conductor part 35T4 for the terminal is disposed near the upper right corner.

The conductor parts 35T1 to 35T4 for the terminals are respectively connected to one ends of the conductor part 351 for the inductor 11, the conductor part 352 for the inductor 12, and the conductor parts 357A and 357B for the inductor 17. The conductor part 351 for the inductor 11, the conductor part 352 for the inductor 12 are both linear conductor parts extending in a ring shape from one end to the other end.

Each of the conductor part 351 for the inductor 11, the conductor part 352 for the inductor 12, and the conductor parts 35T1 to 35T4 for the terminals are disposed at the positions respectively overlapping with the conductor part 341 for the inductor 11, the conductor part 342 for the inductor 12, and the conductor parts 34T1 to 34T4 for the terminals illustrated in FIG. 4A when viewed from the direction (the same as the direction perpendicular to the first surface of the dielectric layer 35) that is perpendicular to the first surface 21a of the magnetic substrate 21. When viewed from the direction perpendicular to the first surface 21a of the magnetic substrate 21, the conductor parts 357A and 357B for the inductor 17 are disposed at the positions overlapping with the conductor part 347 for the inductor 17 illustrated in FIG. 4A.

The LC composite component 1 includes conductor parts 35V1, 35V2, 35V3, 35V4, 35V5, 35V6, 35V7, and 35V8 that penetrate the dielectric layer 35. In FIG. 4B, the conductor parts 35V1 to 35V8 are drawn with a two-dot chain line. To the conductor parts 34T1 to 34T4 for the terminals, the conductor part 341 for the inductor 11, and the conductor part 342 for the inductor 12 illustrated in FIG. 4A, one ends of the conductor parts 35V1 to 35V6 are connected, respectively.

To the conductor part 347 for the inductor 17 illustrated in FIG. 4A, one end of each of the conductor parts 35V7 and 35V8 is connected. To the conductor parts 35T1 to 35T4 for the terminals and the conductor parts 351, 352, 357A, and 357B for the inductors, the other ends of the conductor parts 35V1 to 35V8 are connected, respectively.

FIG. 4C illustrates the magnetic layer 22, the dielectric layer 36, and conductor parts 41, 42, 43, and 44 for the terminals that penetrate the magnetic layer 22 and the dielectric layer 36. The LC composite component 1 includes the conductor parts 41, 42, 43, and 44 for the terminals that penetrate the magnetic layer 22 and the dielectric layer 36. In FIG. 4C, the conductor parts 41 to 44 for the terminals are hatched. To the conductor parts 35T1 to 35T4 illustrated in FIG. 4B, one ends of the conductor parts 41 to 44 for the terminals are connected, respectively.

Figure 5:
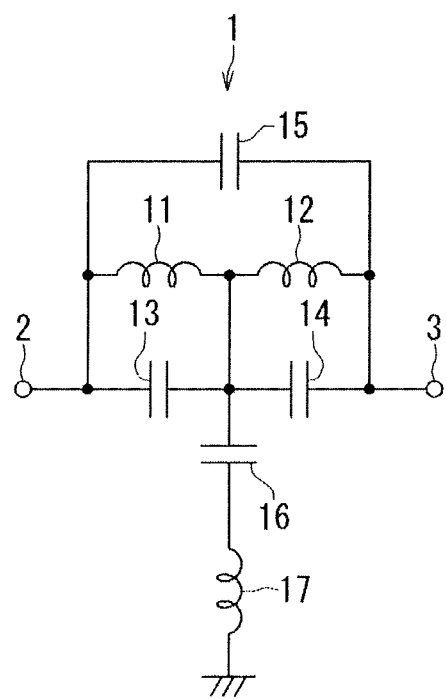
FIG. 5 is a circuit diagram illustrating a circuit structure of the LC composite component according to one embodiment of the present invention.

Next, with reference to a circuit diagram in FIG. 5, the circuit structure of the LC composite component 1 according to the present embodiment is described. In the present embodiment, the LC composite component 1 has a function of a low-pass filter. As illustrated in FIG. 5, the LC composite component 1 includes an input terminal 2 to which a signal is input, an output terminal 3 that outputs a signal, the three inductors 11, 12, and 17, and the four capacitors 13, 14, 15, and 16.

One end of the inductor 11, one end of the capacitor 13, and one end of the capacitor 15 are electrically connected to the input terminal 2. One end of the inductor 12, one end of the capacitor 14, and one end of the capacitor 16 are electrically connected to the other end of the inductor 11 and the other end of the capacitor 13. The other end of the inductor 12, the other end of the capacitor 14, and the other end of the capacitor 15 are electrically connected to the output terminal 3. One end of the inductor 17 is electrically connected to the other end of the capacitor 16. The other end of the inductor 17 is connected to the ground.

The relation between the circuit structure illustrated in FIG. 5 and the specific structure of the LC composite component 1 illustrated in FIG. 1, FIG. 2, FIGS. 3A to 3C, and FIGS. 4A to 4C is further described. The input terminal 2 illustrated in FIG. 5 is structured by the other end of the conductor part 41 for the terminal in FIGS. 4A to 4C. The output terminal 3 illustrated in FIG. 5 is structured by the other end of the conductor part 42 for the terminal in FIGS. 4A to 4C. Each of the other ends of the conductor parts 43 and 44 for the terminals illustrated in FIGS. 4A to 4C forms a ground terminal that is connected to the ground in FIG. 5.

The inductor 11 in FIG. 5 is formed by the conductor parts 311, 331, 341, and 351 for the inductor 11, and the conductor parts 33V5, 34V5, and 35V5 in FIGS. 3A to 3C and FIGS. 4A to 4C, and has a coil structure. As illustrated in FIG. 2, the core part 23 penetrates the dielectric layers 32 to 36 and is positioned inside an inner peripheral part of the coil structure formed by the conductor parts 311, 331, 341, and 351 for the inductor 11 and the conductor parts 33V5, 34V5, and 35V5. The conductor parts 311, 331, 341, and 351 for the inductor 11 are all linear conductor parts extending along the outer periphery of the core part 23.

The inductor 12 in FIG. 5 is formed by the conductor parts 312, 332, 342 and 352 for the inductor 12 and the conductor parts 33V6, 34V6, and 35V6 in FIGS. 3A to 3C and FIGS. 4A to 4C and has a coil structure. As illustrated in FIG. 2, the core part 24 penetrates the dielectric layers 32 to 36 and is positioned inside the inner peripheral part of the coil structure formed by the conductor parts 312, 332, 342 and 352 for the inductor 12 and the conductor parts 33V6, 34V6, and 35V6. The conductor parts 312, 332, 342 and 352 for the inductor 12 are all linear conductor parts extending along the outer periphery of the core part 24.

The inductor 17 in FIG. 5 is formed by the conductor parts 337, 347, 357A and 357B for the inductor 17 and the conductor parts 34V7, 35V7, and 35V8 in FIGS. 3A to 3C and FIGS. 4A to 4C and has a coil structure.

(Operation Effect)

By the LC composite component according to the present embodiment, while the insertion loss of the low-frequency signal with less than the cut-off frequency is reduced, the insertion loss of the high-frequency signal with more than the cut-off frequency can be increased. Therefore, the characteristic as the low-pass filter can be improved. In particular, this is suitable for the low-pass filter with a cut-off frequency of 1.1 to 1.6 GHz. The cut-off frequency can be defined as a point of −3 dB. This LC composite component can be used as a high-pass filter, a band-pass filter instead of the low-pass filter.

(One Example of Manufacturing Method)

Next, a manufacturing method for the LC composite component 1 according to the present embodiment is described with reference to FIG. 1. In the LC composite component 1 according to the present embodiment, a plurality of components other than the magnetic substrate 21 of the LC composite component 1 are formed on a wafer including a part to serve as the magnetic substrate 21 of the LC composite components 1. Thus, a fundamental structure in which a plurality of lines of component main bodies 20 of the LC composite components 1 are arranged is manufactured. Then, by cutting this fundamental structure, the component main bodies 20 are separated from each other. Thus, the LC composite components 1 are manufactured.

Hereinafter, one LC composite component 1 is focused and the manufacturing method for the LC composite component 1 according to the present embodiment is further described with reference to FIG. 2, FIGS. 3A to 3C, and FIGS. 4A to 4C. In the following description, the part on the wafer that will become the magnetic substrate 21 is referred to as the magnetic substrate 21 for convenience. In the manufacturing method according to the present embodiment, first, a plurality of dielectric layers and a plurality of conductor parts are formed on the magnetic substrate 21 using a thin-film formation technique. Specifically, first, the dielectric layer 31 is formed on the first surface 21a of the magnetic substrate 21. Next, on the dielectric layer 31, the conductor parts 31T1 to 31T4 and 311 to 316 illustrated in FIG. 3A are formed. A forming method for the conductor parts may be a method in which, after a conductor layer that is not patterned is formed, the conductor layer is patterned by etching using a mask or a method in which a conductor layer that is patterned using the mask is formed. The forming method for the conductor layer may be various thin-film forming methods such as a sputtering method and a plating method. The forming method for the other conductor parts to be described below is similar to this.

Next, the dielectric layer 32 is formed on the dielectric layer 31 and the conductor parts 31T1 to 31T4 and 311 to 316 by the sputtering method or the like, for example. Next, on the dielectric layer 32, the conductor parts 323, 324, 325A, 325B, and 326 for the capacitors illustrated in FIG. 3B are formed. Next, the dielectric layer 33 is formed. Subsequently, six holes for the conductor parts 33V1 to 33V6 are formed in the dielectric layers 32 and 33, and five holes for the conductor parts 33V7 and 33V11 are formed in the dielectric layer 33. Next, the conductor parts 33V1 to 33V6, 331, 332, 337, 333, 334, 335A, 335B, 336, 33T1, 33T2, 33T3, and 33T4 illustrated in FIGS. 3B and 3C are formed.

Next, the dielectric layer 34 is formed on the dielectric layer 33 and the conductor parts. Subsequently, seven holes for the conductor parts 34V1 to 34V7 are formed in the dielectric layer 34. Next, the conductor parts 341, 342, 347, 34T1, 34T2, 34T3, and 34T4 illustrated in FIG. 4A are formed. Next, the dielectric layer 35 is formed on the dielectric layer 34. Then, eight holes for the conductor parts 35V1 to 35V8 are formed in the dielectric layer 35. Subsequently, the conductor parts 351, 352, 357A, 357B, 35T1, 35T2, 35T3, and 35T4 illustrated in FIG. 4B are formed. Next, the dielectric layer 36 is formed on the dielectric layer 35 and the conductor parts.

Next, four holes for the conductor parts 41 to 44 for the terminals are formed in the dielectric layer 36. Next, conductor parts 41 to 44 for the terminals illustrated in FIG. 4C are formed by the plating method or the like, for example.

Next, two holes for the core parts 23 and 24 are formed in the dielectric layers 32 to 36. Then, a preliminary magnetic layer that later serves as the magnetic layer 22 and the core parts 23 and 24 is formed in a way of filling the two holes and covering the conductor parts 41 to 44 for the terminals. Next, the preliminary magnetic layer is ground until the conductor parts 41 to 44 for the terminals are exposed. Thus, the part of the preliminary magnetic layer that remains in the two holes for the core parts 23 and 24 becomes the core parts 23 and 24 and the rest becomes the magnetic layer 22. When the magnetic layer 22 and the core parts 23 and 24 have been formed, the fundamental structure is completed. Next, the fundamental structure is cut so that the component main bodies 20 are cut out.

Note that in order to form the core parts 23 and 24 and the magnetic layer (preliminary magnetic layer) 22, a curable composition including resin and the magnetic metal particle described above may be applied and cured.

The present invention is not limited to the above embodiment and can employ various modifications.

For example, the number of each of capacitors, inductors, and core parts in the LC composite component may be one or more. The mode of the capacitor, inductor, and core part can be changed as appropriate in accordance with the intended purpose. In addition, the arrangement of the inductors and capacitors can be changed. For example, the capacitor may overlap with the other inductor when viewed from the direction perpendicular to the first surface 21a.

In the case where the thickness of the magnetic layer is not uniform, the average thickness may be employed as the thickness of the magnetic layer. In the case where the thickness of the core part is not uniform, the average thickness may be employed as the thickness of the core part. In the case where the LC composite component includes the plurality of core parts, it is only necessary that the thickness of at least one core part and the thickness of the magnetic layer satisfy the aforementioned relation.

In addition, the manufacturing method for the LC composite component 1 according to the present embodiment is not limited to the above method. For example, in the LC composite component 1, at least the dielectric layers and the conductor parts between the magnetic substrate 21 and the magnetic layer 22 may be formed by a low-temperature co-firing method, for example.

EXAMPLES

The present invention is described in more detail with reference to Examples below; however, the present invention is not limited to Examples below.

Example 1

A curable resin composition for forming the magnetic substrate, the magnetic layer and the core parts was prepared by a method described below. That is to say, an aqueous solution of ferrous sulfate and cobalt sulfate was prepared so that the mass ratio between Fe and Co in the magnetic metal particles became 7:3, and these were neutralized partially in an alkali aqueous solution. After the neutralization, the aqueous solution was aerated by bubbling, and by stirring the aqueous solution, needle shaped goethite particles containing Co were obtained. The goethite particles containing Co obtained by filtering the aqueous solution was cleaned with ion exchange water and dried; then, by heating in the air further, hematite particles containing Co were obtained.

The obtained hematite particles containing Co were heated at 550° C. in a furnace with a hydrogen atmosphere. After that, the atmosphere in the furnace was replaced by argon gas and cooling was performed to about 200° C. The temperature was further reduced to room temperature while the oxygen partial pressure was increased up to 21% in 24 hours; thus, the magnetic metal particles including the metal core parts and the metal oxide film and containing Fe and Co as the main component were obtained.

To the obtained magnetic metal particles, epoxy resin and a curing agent were added so that the volume ratio of the magnetic metal particles in the cured product of the resin composition became 40 vol %; then, by kneading the mixture at room temperature with the use of a mixing roll, the resin composition was made into slurry. Thus, the curable resin composition for forming the magnetic substrate, the magnetic layer and the core parts was obtained.

Next, the LC composite component 1 illustrated in FIGS. 1 to 5 was manufactured using a known thin-film forming method. Here, the cured product of the resin composition descried above was used as the material of the magnetic substrate 21, the magnetic layer 22 and the core parts 23 and 24, Cu was used as the electric conductive material of the inductors 11, 12, and 17 and the capacitors 13 to 16, polyimide resin was used as the material of the dielectric layers 31 and 33 to 36, and silicon nitride was used as the material of the dielectric layer 32. The thickness of the core was 100 μM, the thickness of the magnetic layer was 50 μm, the thickness of the magnetic substrate was 60 μm, and the size of the LC composite component when viewed from the thickness direction was 650 μm×500 μm. The cut-off frequency of the LC composite component was 1.2 GHz.

Examples 2 to 7

LC composite components according to Examples 2 to 7 were manufactured similarly to Example 1 except that the thickness of the core part, the thickness of the magnetic layer and the thickness of the magnetic substrate were changed as shown in Table 1. Note that in Examples 2 and 6, as the thickness of the core was reduced, the number of turns in the coil structures of the inductors 11 and 12 was maintained and the lengths of the conductor parts 33V5, 34V5, and 35V5 and the conductor parts 33V6, 34V6, and 35V6 were reduced; thus, the length of the coil structure in the axial direction was reduced. In Examples 4 and 5, as the thickness of the core part was increased, the number of turns in the coil structure of the inductors 11 and 12 was maintained and the lengths of the conductor parts 33V5, 34V5, and 35V5 and the conductor parts 33V6, 34V6, and 35V6 were increased; thus, the length of the coil structure in the axial direction was increased. In any example, the thickness of the core parts 23 and 24 was more than or equal to the length of the coil structure of the inductors 11 and 12 in the axial direction.

Example 8

An LC composite component according to Example 8 was obtained in a manner similar to Example 1 except that in the neutralizing step, the neutralizing ratio by the alkali aqueous solution was decreased and the metal (Fe and Co) ion concentration after the neutralization to be subjected to the oxidization step was decreased and the average major-axis diameter, the aspect value, and the CV value of the magnetic metal particles were changed as shown in Table 1.

Example 9

An LC composite component according to Example 9 was obtained in a manner similar to Example 1 except that in the neutralizing step, the neutralizing ratio by the alkali aqueous solution was increased and the metal (Fe and Co) ion concentration after the neutralization to be subjected to the oxidization step was increased and the average major-axis diameter, the aspect value, and the CV value of the magnetic metal particles were set as shown in Table 1.

Example 10

An LC composite component according to Example 10 was obtained in a manner similar to Example 1 except that in the neutralizing step, the neutralizing ratio by the alkali aqueous solution was increased and the metal (Fe and Co) ion concentration after the neutralization to be subjected to the oxidization step was increased and the average major-axis diameter, the aspect value, and the CV value of the magnetic metal particles were changed as shown in Table 1.

Examples 11 and 12

LC composite components according to Examples 11 and 12 were obtained in a manner similar to Example 1 except that the curable resin composition was prepared so that the volume ratio of the magnetic metal particles in the cured product of the resin composition was 30 vol % and 50 vol %, respectively.

Example 13

An LC composite component according to Example 13 was obtained in a manner similar to Example 1 except that the curable resin composition was prepared so that Co was not added in the manufacture of the magnetic metal particles and the volume ratio of the magnetic metal particles in the cured product of the resin composition was 50 vol %.

Example 14

An LC composite component according to Example 14 was obtained in a manner similar to Example 1 except that the curable resin composition was prepared so that Ni was added instead of Co in the manufacture of the magnetic metal particles and the volume ratio of the magnetic metal particles in the cured product of the resin composition was 50 vol %.

Comparative Example 1

An LC composite component according to Comparative example 1 was obtained in a manner similar to Example 1 except that the thickness of the core was 30 μm. As the thickness of the core part was decreased, the number of turns in the coil structure of the inductors 11 and 12 was maintained and the lengths of the conductor parts 33V5, 34V5, and 35V5 and the conductor parts 33V6, 34V6, and 35V6 were decreased; thus, the length of the coil structure in the axial direction was decreased. That is to say, the thickness of the core parts 23 and 24 was more than or equal to the length of the coil structure of the inductors 11 and 12 in the axial direction.

[Method for Evaluating Magnetic Metal Particles]
(Size and Aspect Ratio of Magnetic Metal Particles)

The magnetic metal particles along the cross section of the magnetic layer of the LC composite components obtained in Examples and Comparative examples were observed by a transmission electron microscope (TEM) with a magnification of 500000; thus, the size of the magnetic metal particle in the major-axis and minor-axis directions (major-axis diameter and minor-axis diameter) (nm) was measured and the aspect ratio was obtained. Similarly, 200 to 500 magnetic metal particles were observed and the average values of the major-axis diameter, the short-axis diameter, and the aspect ratio were calculated. The average value and the CV value of the aspect ratios of the magnetic metal particles, and the average value of the major-axis diameter of the magnetic metal particles are shown in Table 1.

(Saturation Magnetization)

The cured products of the resin compositions obtained in Examples and Comparative examples were processed into 1 mm×1 mm×3 mm, and by using the vibrating sample magnetometer (VSM, manufactured by TAMAKAWA CO., LTD.), the saturation magnetization (emu/g) of the processed composite magnetic body was measured. The results are shown in Table 1.

(Maximum Value and Minimum Value of Insertion Loss of LC Composite Component)

Figure 6:
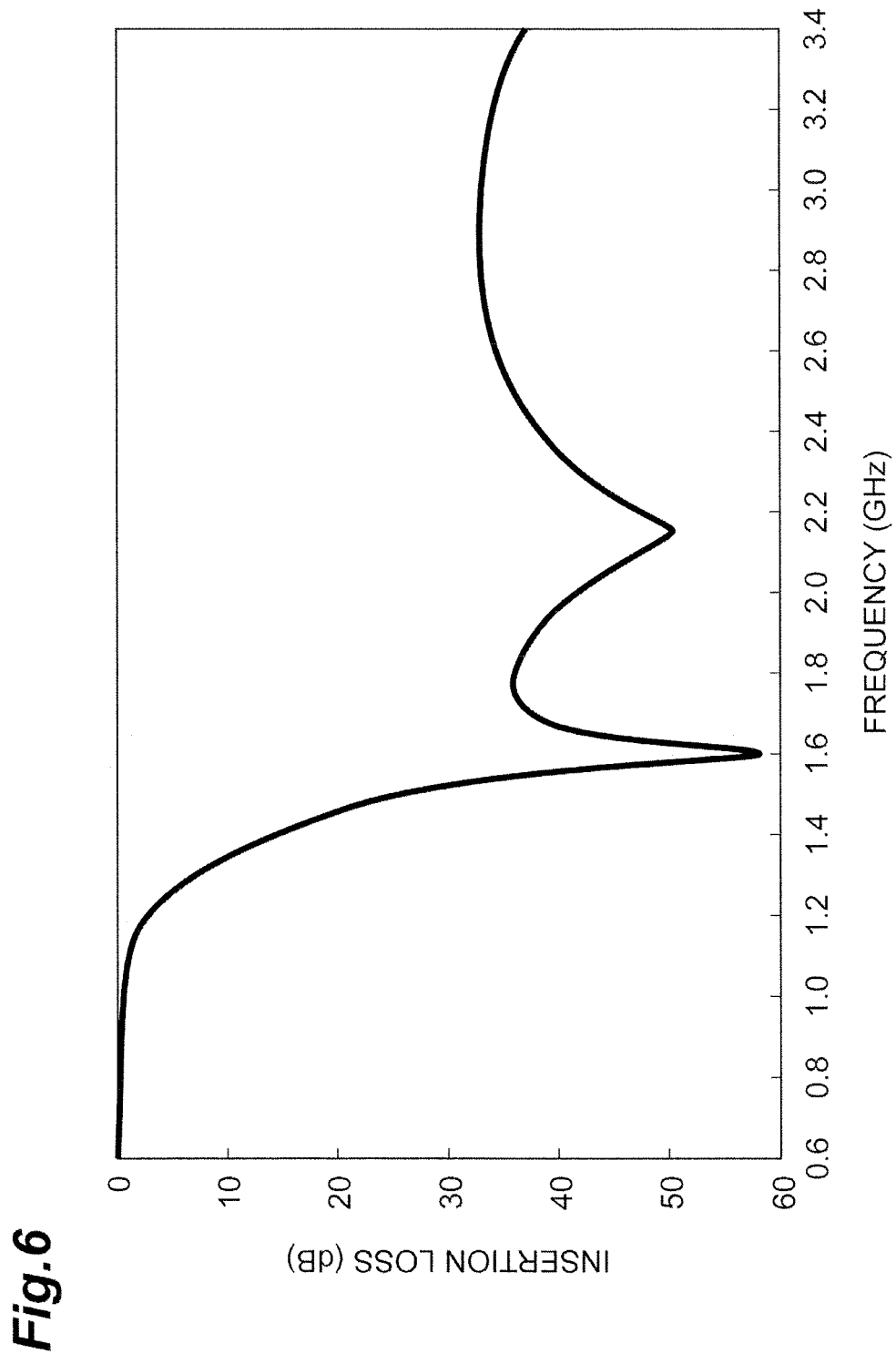
FIG. 6 is a characteristic diagram illustrating a frequency characteristic of insertion loss in an LC composite component according to Example 1.
Figure 7:
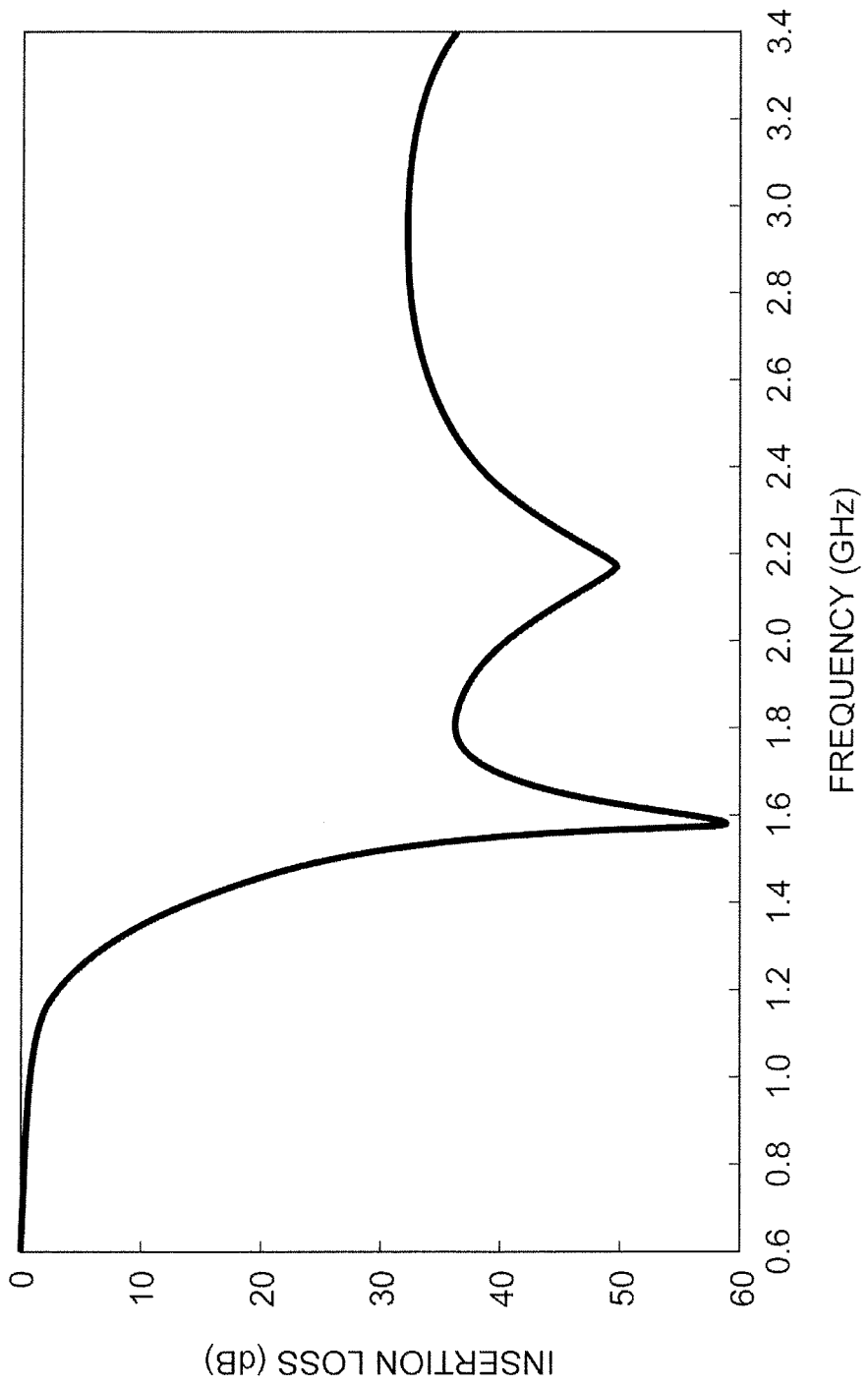
FIG. 7 is a characteristic diagram illustrating a frequency characteristic of insertion loss in an LC composite component according to Example 5.
Figure 8:
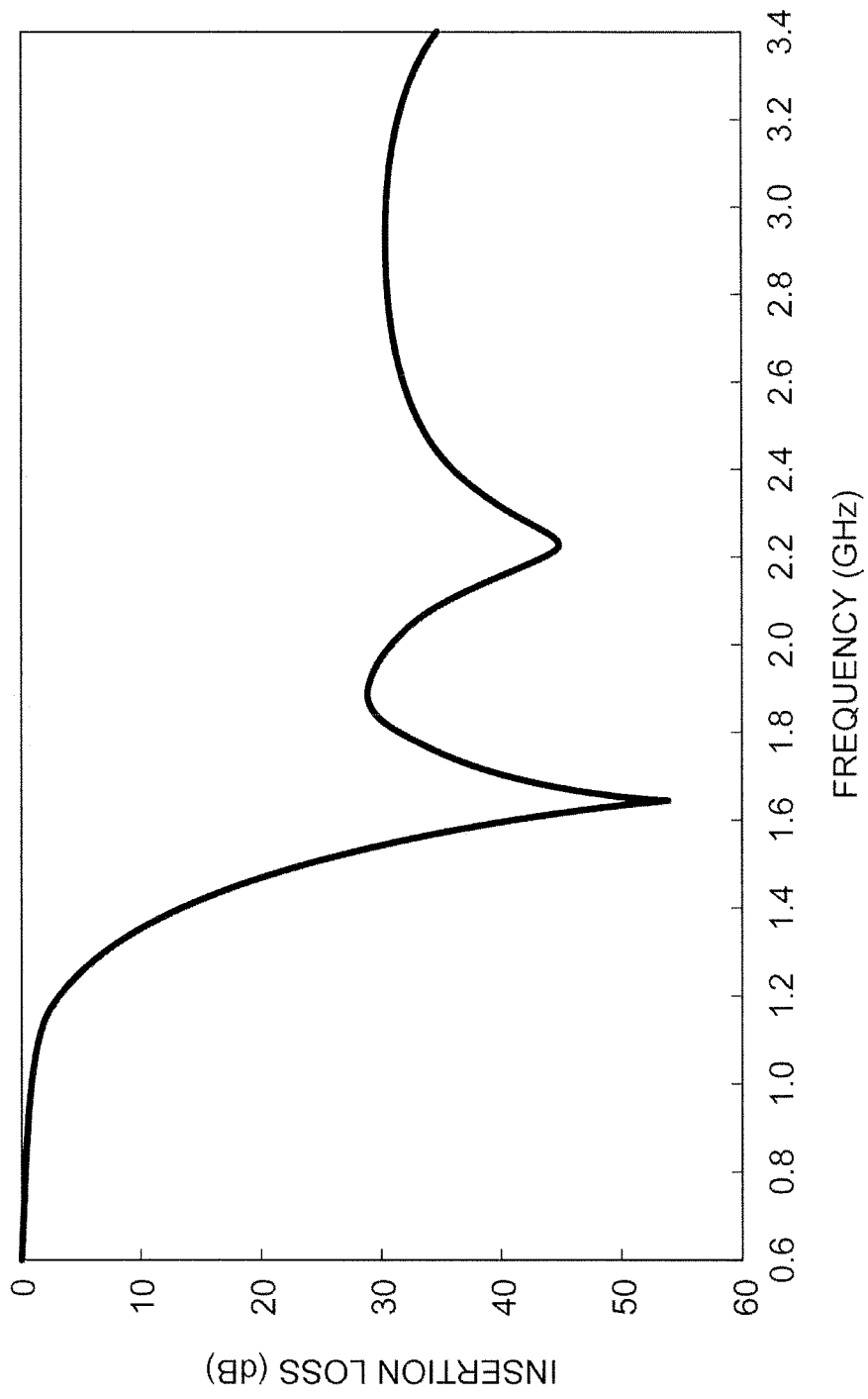
FIG. 8 is a characteristic diagram illustrating a frequency characteristic of insertion loss in an LC composite component according to Comparative example 1.

Using the network analyzer (N5230A, Keysight Technologies), the frequency characteristic of the insertion loss in the LC composite component obtained in each of Examples and Comparative examples was obtained. The maximum value of the insertion loss at 0.824 to 0.960 GHz and the minimum value of the insertion loss at 1.648 to 1.920 GHz were obtained. The results are shown in Table 1. The characteristic diagrams illustrating the frequency characteristic of the insertion loss in each of Example 1, Example 5, and Comparative example 1 are shown in FIGS. 6 to 8.

TABLE 1

| | Metal particle | Major-axis diameter of metal particle (nm) | Aspect ratio | CV value of aspect ratios | Volume ratio of metal particles in cured product (vol %) | Saturation magnetization of cured product (emu/g) | Thickness (T1) of core part (μm) |
|---|---|---|---|---|---|---|---|
| Example 1 | FeCo | 49 | 2.3 | 0.26 | 40 | 121 | 100 |
| Example 2 | FeCo | 48 | 2.3 | 0.25 | 40 | 121 | 50 |
| Example 3 | FeCo | 50 | 2.4 | 0.25 | 40 | 121 | 100 |
| Example 4 | FeCo | 49 | 2.2 | 0.26 | 40 | 121 | 150 |
| Example 5 | FeCo | 47 | 2.5 | 0.27 | 40 | 121 | 150 |
| Example 6 | FeCo | 48 | 2.3 | 0.24 | 40 | 121 | 50 |
| Example 7 | FeCo | 49 | 2.4 | 0.28 | 40 | 121 | 100 |
| Example 8 | FeCo | 33 | 1.3 | 0.20 | 40 | 125 | 100 |
| Example 9 | FeCo | 119 | 5.8 | 0.36 | 40 | 114 | 100 |
| Example 10 | FeCo | 56 | 4.8 | 0.44 | 40 | 118 | 100 |
| Example 11 | FeCo | 45 | 2.3 | 0.26 | 30 | 116 | 100 |
| Example 12 | FeCo | 48 | 2.5 | 0.24 | 50 | 140 | 100 |
| Example 13 | Fe | 35 | 1.4 | 0.19 | 50 | 102 | 100 |
| Example 14 | FeNi | 37 | 1.5 | 0.22 | 50 | 91 | 100 |
| Comparative example 1 | FeCo | 48 | 2.2 | 0.27 | 40 | 121 | 30 |

| | Thickness (T2) of magnetic layer (μm) | Thickness (T3) of magnetic substrate (μm) | T1/T2 | T3/T2 | Maximum value of insertion loss (dB) | Minimum value of insertion loss (dB) |
|---|---|---|---|---|---|---|
| Example 1 | 50 | 60 | 2.0 | 1.2 | 0.40 | 36.0 |
| Example 2 | 50 | 60 | 1.0 | 1.2 | 0.52 | 34.6 |
| Example 3 | 83 | 100 | 1.2 | 1.2 | 0.47 | 35.1 |
| Example 4 | 30 | 60 | 5.0 | 2.0 | 0.37 | 35.8 |
| Example 5 | 50 | 60 | 3.0 | 1.2 | 0.36 | 36.2 |
| Example 6 | 50 | 50 | 1.0 | 1.0 | 0.53 | 32.9 |
| Example 7 | 50 | 150 | 2.0 | 3.0 | 0.51 | 33.0 |
| Example 8 | 50 | 60 | 2.0 | 1.2 | 0.42 | 31.6 |
| Example 9 | 50 | 60 | 2.0 | 1.2 | 0.44 | 32.4 |
| Example 10 | 50 | 60 | 2.0 | 1.2 | 0.44 | 30.1 |
| Example 11 | 50 | 60 | 2.0 | 1.2 | 0.42 | 33.7 |
| Example 12 | 50 | 60 | 2.0 | 1.2 | 0.40 | 32.5 |
| Example 13 | 50 | 60 | 2.0 | 1.2 | 0.48 | 31.3 |
| Example 14 | 50 | 60 | 2.0 | 1.2 | 0.49 | 31.0 |
| Comparative example 1 | 50 | 60 | 0.6 | 1.2 | 0.65 | 29.0 |

The results in Examples 1 to 3 and 5, and Comparative example 1 indicate that the insertion loss characteristic is improved more when T1/T2 is 1.0 or more (Examples 1 to 3 and 5) than when T1/T2 is less than 1.0 (Comparative example 1). In a case where T1/T2 is 1.0 or more, the insertion loss characteristic becomes higher in the following order: the case where T1/T2 is 3.0 (Example 5), the case where T1/T2 is 2.0 (Example 1), the case where T1/T2 is 1.2 (Example 3), and the case where T1/T2 is 1.0 (Example 2).

REFERENCE SIGNS LIST

1 LC composite component
2 Input terminal
3 Output terminal
11, 12, 17 Inductor
13 to 16 Capacitor
20 Component main body
21 Magnetic substrate
22 Magnetic layer
23, 24 Core part
31 to 36 Dielectric layer
33V1 to 33V11, 34V1 to 34V7, 35V1 to 35V8 Conductor part
31T1 to 31T4, 33T1 to 33T4, 34T1 to 34T4, 35T1 to 35T4, 41 to 44 Conductor part for terminal
311, 312, 331, 332, 337, 341, 342, 347, 351, 352, 357A, 357B Conductor part for inductor
313, 315, 316, 323, 324, 325A, 325B, 326 Conductor part for capacitor

What is claimed is:

1. An LC composite component comprising:
a magnetic substrate with magnetism;
a magnetic layer with magnetism;
one or more capacitors;
one or more inductors; and
one or more core parts with magnetism, wherein
the magnetic substrate includes a first surface and a second surface on a side opposite to the first surface, the magnetic layer is disposed to face the first surface of the magnetic substrate, the one or more inductors and the one or more capacitors are disposed between the first surface of the magnetic substrate and the magnetic layer, the one or more core parts are disposed between the first surface of the magnetic substrate and the magnetic layer and connected to the magnetic layer, a thickness of the core part is 1.0 or more times a thickness of the magnetic layer in a direction perpendicular to the first surface of the magnetic substrate, a thickness of the magnetic substrate is 1.0 or more times the thickness of the magnetic layer in the direction perpendicular to the first surface of the magnetic substrate, each of the magnetic substrate, the magnetic layer, and the core parts contains magnetic metal particles and resin, and wherein an average major-axis diameter of the magnetic metal particles is 120 nm or less.

2. The LC composite component according to claim 1, wherein the thickness of the magnetic substrate is 3.0 or less times the thickness of the magnetic layer in the direction perpendicular to the first surface of the magnetic substrate.

3. The LC composite component according to claim 1, wherein the magnetic metal particles contain at least one kind selected from the group consisting of Fe, Co, and Ni as a main component.

4. The LC composite component according to claim 1, wherein an average aspect ratio of the magnetic metal particles is 1.2 to 6.

5. The LC composite component according to claim 1, wherein saturation magnetization of the magnetic substrate, the magnetic layer, and the one or more core parts is 90 emu/g or more.

6. The LC composite component according to claim 1, wherein a CV value of an aspect ratio of the magnetic metal particles is 0.4 or less.

* * * * *